(12) United States Patent
Lu

(10) Patent No.: US 12,439,685 B2
(45) Date of Patent: Oct. 7, 2025

(54) MANUFACTURING METHOD OF ARRAY SUBSTRATE, ARRAY SUBSTRATE, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Macai Lu, Shenzhen (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 80 days.

(21) Appl. No.: 17/435,009

(22) PCT Filed: Jul. 1, 2021

(86) PCT No.: PCT/CN2021/103967
§ 371 (c)(1),
(2) Date: Dec. 8, 2022

(87) PCT Pub. No.: WO2022/252327
PCT Pub. Date: Dec. 8, 2022

(65) Prior Publication Data
US 2024/0014227 A1 Jan. 11, 2024

(30) Foreign Application Priority Data
Jun. 2, 2021 (CN) .......................... 202110614262.7

(51) Int. Cl.
H10D 86/01 (2025.01)
H10D 30/67 (2025.01)
(Continued)

(52) U.S. Cl.
CPC ..... *H10D 86/0221* (2025.01); *H10D 30/6755* (2025.01); *H10D 86/423* (2025.01); *H01L 25/167* (2013.01)

(58) Field of Classification Search
CPC ............. H10D 86/0221; H10D 86/423; H10D 30/6755
See application file for complete search history.

(56) References Cited

U.S. PATENT DOCUMENTS

2012/0001167 A1* 1/2012 Morosawa ......... H10D 30/6755
257/43
2013/0023087 A1 1/2013 Yamazaki et al.
(Continued)

FOREIGN PATENT DOCUMENTS

CN 102315277 A 1/2012
CN 103794555 A 5/2014
(Continued)

OTHER PUBLICATIONS

Chinese Office Action issued in corresponding Chinese Patent Application No. 202110614262.7 dated Mar. 14, 2022, pp. 1-7.
(Continued)

*Primary Examiner* — Peter M Albrecht
(74) *Attorney, Agent, or Firm* — Wei Te Chung; PV IP PC

(57) ABSTRACT

A manufacturing method of an array substrate, the array substrate, and a display panel are provided. In the manufacturing method of the array substrate, by forming an oxide material layer including aluminum atoms on a gate electrode metal layer, and by heating the oxide material layer to allow the aluminum atoms to capture oxygen in the oxide semiconductor layer, an aluminium oxide is formed, and by making the oxide in the oxide semiconductor layer to lose
(Continued)

oxygen to become conductive, a source electrode region and a drain electrode of a thin film transistor are formed.

7 Claims, 6 Drawing Sheets

(51) Int. Cl.
*H10D 86/40* (2025.01)
*H01L 25/16* (2023.01)

(56) References Cited

U.S. PATENT DOCUMENTS

| | | |
|---|---|---|
| 2013/0126859 A1 | 5/2013 | Yeh et al. |
| 2017/0271376 A1* | 9/2017 | Murai .................. H10D 86/423 |
| 2018/0090620 A1 | 3/2018 | Morosawa |

FOREIGN PATENT DOCUMENTS

| | | |
|---|---|---|
| CN | 104659107 A | 5/2015 |
| CN | 104756253 A | 7/2015 |
| CN | 106537567 A | 3/2017 |
| CN | 109103263 A | 12/2018 |
| CN | 111554695 A | 8/2020 |
| CN | 112002763 A | 11/2020 |

OTHER PUBLICATIONS

International Search Report in International application No. PCT/CN2021/103967, mailed on Feb. 28, 2022.

Written Opinion of the International Searching Authority in International application No. PCT/CN2021/103967, mailed on Feb. 28, 2022.

* cited by examiner

MANUFACTURING METHOD OF ARRAY SUBSTRATE, ARRAY SUBSTRATE, AND DISPLAY PANEL

RELATED APPLICATIONS

This application is a Notional Phase of PCT Patent Application No. PCT/CN2021/103967 having international filing date of Jul. 1, 2021, which claims the benefit of priority of Chinese Patent Application No. 202110614262.7 filed on Jun. 2, 2021. The contents of the above applications are all incorporated by reference as if fully set forth herein in their entirety.

BACKGROUND OF INVENTION

Field of Invention

The present application relates to the field of display technology, and particularly to a manufacturing method of an array substrate, the array substrate, and a display panel.

Description of Prior Art

Micro light-emitting diode (micro-LED) display panels and mini light-emitting diode (mini-LED) display panels act as new style displays and perform excellent display characteristics, such as high brightness, high response speed, high contrast, low power consumption, etc. Oxide semiconductor thin film transistors or low-temperature polycrystalline-silicon thin film transistors are generally used in array substrates used in the micro-LED display panels and mini-LED displays. Compared to conventional amorphous silicon thin film transistors, oxide semiconductor thin film transistors have higher mobility and have lower cost advantage than low-temperature polysilicon thin film transistors and application advantages in large generation. However, ion implantation processes are usually adopted in channel manufacturing processes of current oxide semiconductor thin film transistors to implant dopants into semiconductors, the craft are relatively complicated, and the manufacturing processes are difficult.

SUMMARY OF INVENTION

In this light, one purpose of the present application is to provide a manufacturing method of an array substrate, the array substrate, and a display panel which are able to lower difficulty of the manufacturing processes.

The present application provides a manufacturing method of an array substrate, including following steps:
  providing a substrate and forming a semiconductor layer on the substrate, wherein the semiconductor layer includes a first region, and a second region and a third region located on two sides of the first region, and a material of the semiconductor layer is a semiconductor oxide;
  forming a gate insulation layer on a side of the semiconductor layer away from the substrate, wherein the gate insulation layer covers the first region;
  forming a gate electrode on the gate insulation layer, wherein the gate electrode and the gate insulation layer are disposed correspondingly;
  forming an oxide material layer on the gate electrode, wherein the oxide material layer covers the semiconductor layer, the gate insulation layer, and the gate electrode, the oxide material layer is directly connected to the second region and the third region to obtain a semiconductor substrate, and the oxide material includes aluminum atoms; and
  heating the semiconductor substrate, wherein the oxide material layer captures oxygen in the second region and the third region to form an oxide layer, the second region is conductorized to form a source electrode region, and the third region is conductorized to form a drain electrode region.

In one embodiment, the oxide material layer further includes a doping element.

In one embodiment, a material of the oxide material layer is $Al X_a O_c$, and wherein X is the doping element, X is at least one selected from the group consisting of Si, Mg, N, and B, $0.05 \leq a \leq 0.3$, and $0 \leq c < 1.5$.

In one embodiment, the steps of heating the semiconductor substrate to allow the oxide material layer to capture the oxygen in the second region and the third region to form the oxide layer, the second region is conductorized to form a source electrode region, and the third region is conductorized to form the drain electrode region include:
  exposing the oxide material layer in an oxygen-containing atmosphere to make the oxide material layer contact to oxygen to form the oxide layer.

In one embodiment, before the step of providing the substrate and forming the semiconductor layer on the substrate, the manufacturing method of the array substrate further includes: forming a source electrode and a drain electrode on the substrate;
  wherein the source electrode is connected to the source electrode region, and the drain electrode is connected to the drain electrode region.

In one embodiment, after the steps of heating the semiconductor substrate to allow the oxide material layer to capture the oxygen in the second region and the third region to form the oxide layer, the second region is conductorized to form a source electrode region, and the third region is conductorized to form a drain electrode region, the manufacturing method of the array substrate further includes:
  forming a source electrode and a drain electrode on a side of the oxide layer away from the semiconductor layer, wherein the source electrode is connected to the source electrode region, and the drain electrode is connected to the drain electrode region.

In one embodiment, the steps of heating the semiconductor substrate to allow the oxide material layer to capture the oxygen in the second region and the third region to form the oxide layer, the second region is conductorized to form a source electrode region, and the third region is conductorized to form the drain electrode region include:
  heating the semiconductor substrate for 20 minutes to 60 minutes at a temperature in a range from 200° C. to 300° C.

The present application provides an array substrate includes:
  a substrate;
  an active layer located on the substrate, wherein the active layer includes a channel region, and a source electrode region and a drain electrode region located on two sides of the channel region, and a material of the active layer is an oxide semiconductor;
  a gate insulation layer disposed on a side of the active layer away from the substrate, wherein the gate insulation layer covers the channel region;

a gate electrode disposed on a side of the gate insulation layer away from the active layer, wherein the gate electrode and the gate insulation layer are disposed correspondingly; and an oxide layer disposed on a side of the gate electrode away from the gate insulation layer, wherein the oxide material layer covers the active layer, the gate insulation layer, and the gate electrode, the oxide layer is directly connected to the source electrode region and the drain electrode region, and the oxide layer includes aluminium oxide.

In one embodiment, the oxide layer further includes a doping element.

In one embodiment, a material of the oxide layer is AlXaOb, and wherein X is the doping element, X is at least one selected from the group consisting of Si, Mg, N, and B, $0.05 \leq a \leq 0.3$, and $1.5 \leq b < 2.1$.

In one embodiment, $0.2 \leq a \leq 0.3$.

In one embodiment, the array substrate further includes a source electrode and a drain electrode, and the source electrode and the drain electrode are located between the active layer and the substrate.

In one embodiment, the array substrate further includes a source electrode and a drain electrode, the source electrode and the drain electrode are located on a side of the oxide layer away from the active layer, and the oxide layer is an interlayer insulation layer.

In one embodiment, the array substrate includes a driving transistor and a switch transistor, the driving transistor and/or the switch transistor includes the active layer, the gate insulation layer, the gate electrode, and the oxide layer.

The present application further provides a display panel including an array substrate. The array substrate includes:
a substrate;
an active layer located on the substrate, wherein the active layer includes a channel region, and a source electrode region and a drain electrode region located on two sides of the channel region, and a material of the active layer is an oxide semiconductor;
a gate insulation layer disposed on a side of the active layer away from the substrate, wherein the gate insulation layer covers the channel region;
a gate electrode disposed on a side of the gate insulation layer away from the active layer, wherein the gate electrode and the gate insulation layer are disposed correspondingly; and
an oxide layer disposed on a side of the gate electrode away from the gate insulation layer, wherein the oxide material layer covers the active layer, the gate insulation layer, and the gate electrode, the oxide layer is directly connected to the source electrode region and the drain electrode region, and the oxide layer includes aluminium oxide.

In one embodiment, the oxide layer further includes a doping element.

In one embodiment, a material of the oxide layer is AlXaOb, and wherein X is the doping element, X is at least one selected from the group consisting of Si, Mg, N, and B, $0.05 \leq a \leq 0.3$, and $1.5 \leq b < 2.1$.

In one embodiment, $0.2 \leq a \leq 0.3$.

In one embodiment, the array substrate further includes a source electrode and a drain electrode, and the source electrode and the drain electrode are located between the active layer and the substrate.

In one embodiment, the array substrate further includes a source electrode and a drain electrode, the source electrode and the drain electrode are located on a side of the oxide layer away from the active layer, and the oxide layer is an interlayer insulation layer.

The present application provides a manufacturing method of an array substrate, the array substrate, and a display panel.

The manufacturing method of the array substrate of the present application includes following steps: providing a substrate and forming a semiconductor layer on the substrate, wherein the semiconductor layer includes a first region, and a second region and a third region located on two sides of the first region, and a material of the semiconductor layer is a semiconductor oxide; forming a gate insulation layer on a side of the semiconductor layer away from the substrate, wherein the gate insulation layer covers the first region; forming a gate electrode on the gate insulation layer, wherein the gate electrode and the gate insulation layer are disposed correspondingly; forming an oxide material layer on the gate electrode, wherein the oxide material layer covers the semiconductor layer, the gate insulation layer, and the gate electrode, the oxide material layer is directly connected to the second region and the third region to obtain a semiconductor substrate, and the oxide material includes aluminum atoms; and heating the semiconductor substrate, wherein the oxide material layer captures oxygen in the second region and the third region to form an oxide layer, the second region is conductorized to form a source electrode region, and the third region is conductorized to form a drain electrode region.

In the manufacturing method of the array substrate on the present application, by forming the oxide material layer including the aluminum atoms on the gate electrode metal layer, by heating the oxide material layer to allow the aluminum atoms to capture the oxygen in the oxide semiconductor layer to form the aluminium oxide, and by making the oxide in the oxide semiconductor layer to lose oxygen to become conductive, the source electrode region and the drain electrode of the thin film transistor are formed. Compared to source electrode regions and drain electrode region formed in oxide semiconductor layers by ion doping in the prior art, the process of the array substrate of the present application is simple and has low difficulty. In addition, because the oxide semiconductor thin film transistor is relatively sensitive to water vapor, under influence of water vapor, performance of the oxide semiconductor thin film transistor is prone to change and fails. Aluminum atoms form the transparent and dense aluminum oxide film after capturing oxygen in the oxide semiconductor layer, which can effectively prevent water vapor from invading and can improve device performance.

DESCRIPTION OF DRAWINGS

To more clearly illustrate the technical solutions of the embodiments of the present application, the accompanying figures of the present application will be described in brief. Obviously, the accompanying figures described below are only part of the embodiments of the present application, from which figures those skilled in the art can derive further figures without making any inventive efforts.

DETAILED DESCRIPTION OF PREFERRED EMBODIMENTS

The technical solutions in the embodiments of the present application are clearly and completely described in the following with reference to the accompanying drawings in the embodiments of the present application. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

In the present disclosure, unless expressly specified or limited otherwise, a first feature is "on" or "beneath" a second feature may include that the first feature is directly connected the second feature and may also include that the first feature being not directly connected to the second feature, but contacts to the second feature by other features between them. Furthermore, a first feature "on," "above," or "on top of" a second feature may include an embodiment in which the first feature is right "on," "above," or "on top of" the second feature and may also include that the first feature is not right "on," "above," or "on top of" the second feature, or just means that the first feature has a sea level elevation higher than the sea level elevation of the second feature. While first feature "beneath," "below," or "on bottom of" a second feature may include that the first feature is "beneath," "below," or "on bottom of" the second feature and may also include that the first feature is not right "beneath," "below," or "on bottom of" the second feature, or just means that the first feature has a sea level elevation lower than the sea level elevation of the second feature.

Figure 1:
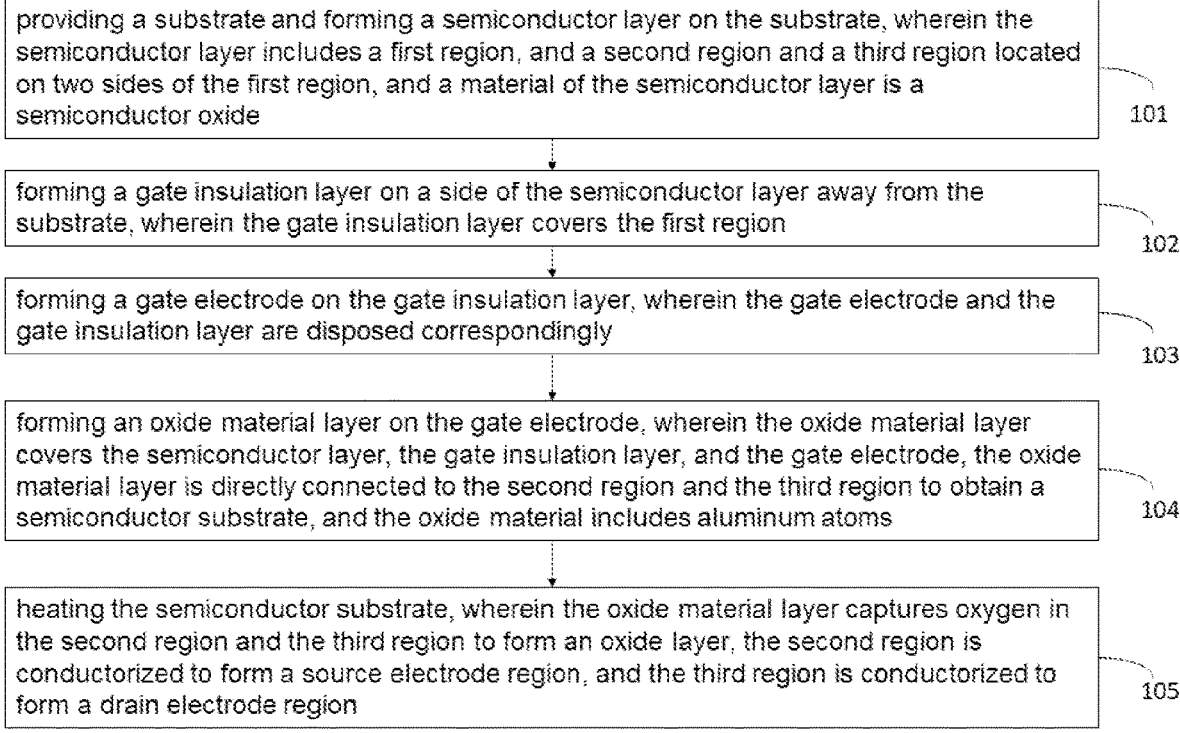
FIG. 1 is a flowchart of a manufacturing method of a thin film transistor provided by the present application.

Please refer to FIG. 1. FIG. 1 is a flowchart of a manufacturing method of an array substrate provided by the present application. The manufacturing method of the array substrate provided by the present application includes following steps.

101: providing a substrate and forming a semiconductor layer on the substrate, wherein the semiconductor layer includes a first region, and a second region and a third region located on two sides of the first region, and a material of the semiconductor layer is a semiconductor oxide.

In the semiconductor layer, by depositing a semiconductor material on the substrate, the first region, the second region and the third region are formed by patterning through a photomask. For example, the material of the semiconductor layer can be indium gallium zinc oxide (IGZO), indium gallium tin oxide (IGTO), indium gallium zinc tin oxide (IGZTO), indium gallium oxide (IGO), indium zinc oxide (IZO), indium zinc tin oxide (IZTO), aluminum indium zinc oxide (AIZO), etc.

102: forming a gate insulation layer on a side of the semiconductor layer away from the substrate, wherein the gate insulation layer covers the first region.

The gate insulation layer is formed by depositing an inorganic insulation material on the semiconductor layer and by patterning through a photomask. A material of the gate insulation layer can be SiOx, SiNx, $Al_2O_3$/SiNx/SiOx, or SiOx/SiNx/SiOx, etc.

103: forming a gate electrode on the gate insulation layer, wherein the gate electrode and the gate insulation layer are disposed correspondingly.

The gate electrode is formed by depositing a gate metal material on the substrate and by patterning through a photomask. A material of the gate electrode metal layer can be Mo, Mo/Al, Mo/Cu, Mo/Cu/IZO, IZO/Cu/IZO, Mo/Cu/ITO, Ni/Cu/Ni, MoTiNi/Cu/MoTiNi, NiCr/Cu/NiCr, or CuNb, etc.

104: forming an oxide material layer on the gate electrode, wherein the oxide material layer covers the semiconductor layer, the gate insulation layer, and the gate electrode, the oxide material layer is directly connected to the second region and the third region to obtain a semiconductor substrate, and the oxide material includes aluminum atoms; and The oxide material layer is obtained by depositing an oxide material layer on the gate electrode. In one embodiment, the oxide material layer can be obtained by sputtering an aluminum target on the gate electrode. In subsequent processes, by heating the oxide material layer to allow aluminum atoms to capture oxygen in the oxide semiconductor material to form the aluminium oxide, and by making the oxide in the oxide semiconductor layer to lose oxygen to become conductive, the source electrode region and the drain electrode of the thin film transistor are formed. Compared to source electrode regions and drain electrode region formed in oxide semiconductor layers by ion doping in the prior art, the process of the array substrate of the present application is simple and has low difficulty. In addition, because the oxide semiconductor thin film transistor is relatively sensitive to water vapor, under influence of water vapor, performance of the oxide semiconductor thin film transistor is prone to change and fails. Aluminum atoms form the transparent and dense aluminum oxide film after capturing oxygen in the oxide semiconductor layer, which can effectively prevent water vapor from invading and can improve device performance.

In one embodiment, the oxide material layer further includes a doping element. The oxide material layer is formed by simultaneously sputtering through using a target of aluminum and doping element. Furthermore, the doping element can be selected as a doping element which easily to form a stable oxide with oxygen or aluminum. The doping element can be at least one selected from from the group consisting of Si, Mg, N, and B. After doping, an oxidation temperature can be lowered to ensure that the aluminum is completely oxidized.

In one embodiment, a material of the oxide material layer is AlXaOc, and wherein X is the doping element, X is at least one selected from the group consisting of Si, Mg, N, and B, $0.05 \leq a \leq 0.3$, and $0 \leq c < 1.5$. It should be noted that when a and c are both 0, the material of the oxide material layer is a metal of aluminum. When a is 0 and c is not 0, the material of the oxide material layer includes oxygen and aluminum. Furthermore, because $c<1.5$, only part of the aluminum in the oxide material layer is oxidized, not all of it is oxidized. When a is not 0 and c is 0, the material of the oxide material layer is aluminum and the doping element.

When $0.05 \leq a \leq 0.3$, aluminum oxide in the oxide material layer dominates a leading position, and the doping element is in a secondary position, which can capture more oxygen in the oxide semiconductor. Therefore, a purpose of improving conductivity of the source electrode region and the drain electrode region can be realized. By mixing the doping element in the oxide material layer, carrier mobility at a surface where the oxide material layer contacts to the source electrode region and the drain electrode region can be enhanced, resistance of the source electrode region and the drain electrode region can be reduced, and conductivity of the source electrode region and the drain electrode region can be increased. In addition, during the formation process of the oxide layer, the doping element included in the oxide material layer penetrates into the semiconductor layer to form the source electrode region and the drain electrode region, which allows to improve the conductivity of the source electrode region and the drain electrode.

Specifically, the material of the oxide material layer can be AlSiaOc, AlMgaOc, AlNaOc, AlCaOcc, Al(SixMgy)aOc, Al(SixNy)aOc, Al(SixCy)aOc, Al(MgxNy)aOc, Al(MgxCy)aOc, Al(NxCy) aOc, Al (SiiMgjNk)aOc, Al(MgiNjCk)aOc, wherein, x+y=1, and i+j+k=1.

In one embodiment, $0.2 \leq a \leq 0.3$. Experiments have proved that when $0.2 \leq a \leq 0.3$, a better effect of improving the conductivity of the source electrode region and the drain electrode region can be achieved.

In one specific embodiment, a material of the oxide material layer is AlSiaOc, and wherein $0.05 \leq a \leq 0.3$, and $0 \leq c < 1.5$. Two materials of aluminum and silicon together can ensure fully oxidization at a lower temperature, such as 200° C., so difficulty of the process is lowered.

105: heating the semiconductor substrate, wherein the oxide material layer captures oxygen in the second region and the third region to form an oxide layer, the second region is conductorized to form a source electrode region, and the third region is conductorized to form a drain electrode region to obtain an array substrate.

In the step 105, metallization occurs in the second region and the third region of the oxide semiconductor. The metallization means that a semiconductor is processed to become a conductor, which mainly refer to that the oxygen and the aluminum in the oxide semiconductor are combined during a baking process, resulting in reduction of oxygen in an oxide semiconductor film layer and forming a good characteristic of a conductor. The transparent and dense aluminum oxide film can be formed from aluminium oxide, which can effectively prevent water vapor from invading and can improve device performance.

Specifically, the step S105 includes exposing the oxide material layer in an oxygen-containing atmosphere to make the oxide material layer contact to oxygen to form the array substrate. Aluminum is a conductor and needs to be oxidized with oxygen in an environment during a baking process. The only oxygen in the oxide semiconductor is not enough to completely oxidize aluminum. Therefore, the oxide material layer needs to be exposed to the oxygen-containing atmosphere and completely oxidized by oxygen in external environment to form a transparent conductive film.

The step 105 further includes heating the semiconductor substrate for 20 minutes to 60 minutes at a temperature in a range from 200° C. to 300° C. At this temperature, the aluminum can be oxidized but not be too slow. Significantly exceeding the heating temperature or the heating time, such as the heating temperature above 300° C., or the heating time at more than 1 hour, may cause external oxygen to diffuse into an interior of a semiconductor channel excessively during the baking process, resulting in conductorization failure, or the gate electrode of the thin film transistor being oxidized. Because the oxide material layer captures the oxygen in the thin film transistor, oxidization of the gate electrode, the source electrode, and metals of the drain electrode being can be well prevented.

In one embodiment, a thickness of the oxide material layer ranges from 5 nm to 15 nm. If the thickness exceeds 15 nm, the display panel is caused to be scrapped. If the thickness is less than 5 nm, the thin film transistor with improved mobility cannot be obtained.

In one specific embodiment, the baking temperature can be 250° C., and the baking time can be 30 minutes with an atmosphere with dry air.

In one embodiment, before the step 101, the manufacturing method of the array substrate further includes forming a source electrode and a drain electrode on the substrate, wherein the source electrode is connected to the source electrode region, and the drain electrode is connected to the drain electrode region.

The source electrode and the drain electrode are formed by depositing a material of a source-and-drain electrode metal on the substrate and by patterning through a photomask.

In one embodiment, after the step 105, the manufacturing method of the array substrate further includes forming the source electrode and the drain electrode on a side of the oxide layer away from the active layer, wherein the source electrode is connected to the source electrode region, and the drain electrode is connected to the drain electrode region. In this embodiment, the oxide layer can be an interlayer insulation layer. In other embodiment, an oxide layer between the gate electrode and the interlayer insulation layer can be disposed additionally.

In one embodiment, after the step 105, the manufacturing method of the array substrate further includes:

step 106: forming a passivation layer on the oxide layer.

The passivation layer is formed by depositing an inorganic insulating material on the oxide layer.

The material of the passivation layer can be SiOx, SiNx, SiNOx, SiOx/SiNx, AlOx or a stacked layer thereof.

Step 107: forming a connection layer on the passivation layer.

In the step 107, via holes are defined in the passivation layer, a material of the connection layer is deposited on the passivation layer, and the connection layer is formed by patterning through a photomask. The connection layer can be used to connect two or more transistors in the display panel. For example, when a pixel circuit of the display panel includes a driving transistor and a switching transistor, the connection layer can be used to connect the driving transistor and the switching transistor.

The material of the connection layer can be indium tin oxide (ITO), indium zinc oxide (IZO) or a metal-type film layer, such as Mo, MoTi, MoTiNi, Mo/Cu/Mo, Mo/Al, Mo/Cu, Mo/Cu/IZO, IZO/Cu/IZO, Mo/Cu/ITO, Ni/Cu/Ni, MoTiNi/Cu/MoTiNi, NiCr/Cu/NiCr, or CuNb.

In the manufacturing method of the array substrate on the present application, by forming the oxide material layer including the aluminum atoms on the gate electrode metal layer, by heating the oxide material layer to allow aluminum atoms to capture oxygen in the oxide semiconductor material to form the aluminium oxide, and by making the oxide in the oxide semiconductor layer to lose oxygen to become conductive, the source electrode region and the drain electrode of the thin film transistor are formed. Compared to source electrode regions and drain electrode region formed in oxide semiconductor layers by ion doping in the prior art, the process of the array substrate of the present application is simple and has low difficulty. In addition, because the oxide semiconductor thin film transistor is relatively sensitive to water vapor, under influence of water vapor, performance of the oxide semiconductor thin film transistor is prone to change and fails. Aluminum atoms form the transparent and dense aluminum oxide film after capturing oxygen in the oxide semiconductor layer, which can effectively prevent water vapor from invading and can improve device performance.

Hereinafter, specific embodiments are used to describe the manufacturing method of the array substrate of the present application.

It should be noted that manufacturing processes of the display panel is described as follow.

Please refer to FIG. 2(a) to FIG. 2(i). FIG. 2(a) to FIG. 2(i) are sectional schematic diagrams of a first embodiment of the manufacturing method of the display panel of the present application.

Figure 2A:
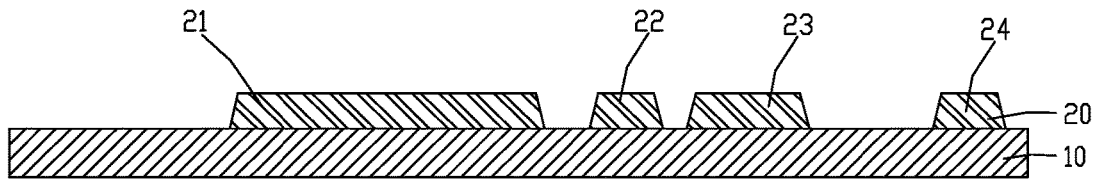
FIG. 2(a) to FIG. 2(i) are sectional schematic diagrams of a first embodiment of the manufacturing method of the display panel of the present application.

Please refer to FIG. 2(a). A substrate 10 is provided. The substrate 10 can be a rigid substrate such as a glass substrate, a plastic substrate, etc., or also can be a flexible substrate. The flexible substrate can include a single flexible organic layer, or can include two or more flexible organic layers, and a barrier layer disposed between two adjacent flexible organic layers. A material of the flexible organic layer is selected from one or more of polyimide (PI), polyethylene naphthalate (PEN), polyethylene terephthalate (PET), polyarylate (PAR), polycarbonate (PC), polyetherimide (PEI), or polyethersulfone (PES). A material of the barrier layer is selected from one or more of inorganic materials such as silicon dioxide, silicon nitride, etc. A source drain electrode metal layer 20 is formed on the substrate 10. The source drain electrode metal layer 20 includes a first source electrode 21, a first drain electrode 22, a second source electrode 23, and a second drain electrode 24 sequentially arranged and disposed on the substrate 10. In this embodiment, the first source electrode 21 acts as a light shielding layer of the active layer 40 and acts as one plate of a storage capacitor Cst to perform a function simultaneously. Therefore, the first source electrode 21 extends in an arrangement direction of the storage capacitor Cst and the driving transistor T1.

Figure 2B:
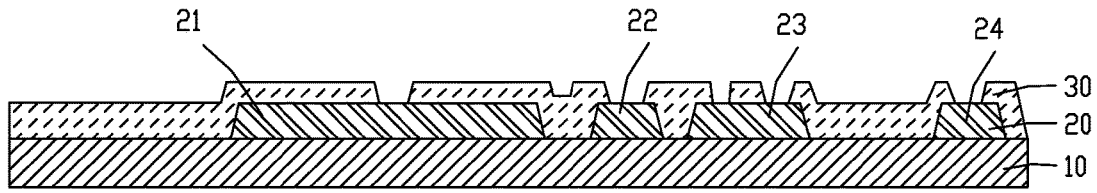

Please refer to FIG. 2(a) to FIG. 2(b). An interlayer insulation layer 30 is formed on the source drain electrode metal layer 20. The interlayer insulation layer 30 covers the first source electrode 21, the first drain electrode 22, the second source electrode 23, and the second drain electrode 24. Via holes are defined on the interlayer insulation layer 30.

Figure 2C:
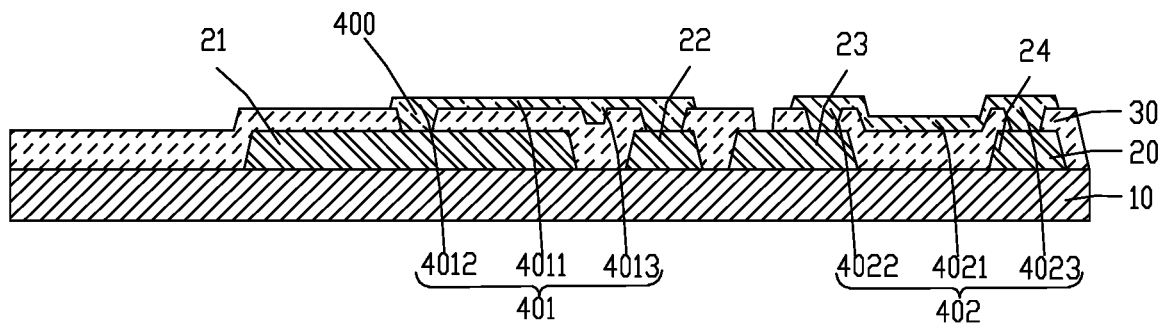

Please refer to FIG. 2(b) to FIG. 2(c). A semiconductor layer 400 is formed on the interlayer insulation layer 30. The semiconductor layer 400 includes a first portion 401 and a second portion 402. The first portion 401 is disposed above the first source electrode 21 and the first drain electrode 22. The first portion 401 includes a first region 4011 and a second region 4012 and a third region 4013 located on both sides of the first region 4011. The first region 4011 is disposed corresponding to the first source electrode 21. The first source electrode 21 is used as a light shielding layer in the first region 4011. Specifically, an orthographic projection of the first source electrode 21 on the semiconductor layer 400 can cover the first region 4011. The second region 4012 is connected to the first source electrode 21 through the via hole defined in the interlayer insulation layer 30. The third region 4013 is connected to the first drain electrode 22 through the via hole defined in the interlayer insulation layer 30. The second portion 402 is disposed above the second source electrode 23 and the second drain electrode 22. The second portion 402 includes a fourth region 4021, and a fifth region 4022 and a sixth region 4023 located on both sides of the fourth region 4021. The fifth region 4022 is connected to the second source electrode 23 through the via hole defined in the interlayer insulation layer 30. The sixth region 4023 is connected to the second drain electrode 24 through the via hole defined in the interlayer insulation layer 30. A material of the semiconductor layer 400 is a metal oxide semiconductor.

Figure 2D:
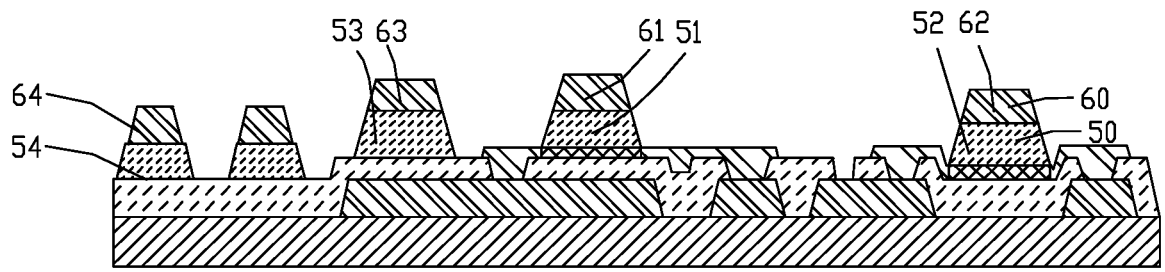

Please refer to FIG. 2(c) to FIG. 2(d). A gate insulation layer 50 is formed on the semiconductor layer 400. The gate insulation layer 50 includes a first gate insulation layer 51, a second gate insulation layer 52, and a third gate insulation layer 53. The third gate insulation layer 53 is located on a side of the first gate insulation layer 51 away from the second gate insulation layer 52. The first gate insulation layer 51 covers the first region 4011. The second gate insulation layer 52 covers the fourth region 4021. The third gate insulation layer 53 is disposed opposite to the first source electrode 21. The gate insulation layer 50 further includes a fourth gate insulation layer 54. The fourth gate electrode 54 is located on a side of the third gate insulation layer 53 away from the first gate insulation layer 51. A gate electrode metal layer 60 is formed on the gate insulation layer 50. The gate electrode metal layer 60 includes a first gate electrode 61, a second gate electrode 62, and a storage capacitor plate 63. The storage capacitor plate 63 is located on a side of the first gate electrode 61 away from the second gate electrode 62. The first gate electrode 61 is disposed on the first gate insulation layer 51 and is disposed corresponding to the first gate insulation layer 51. The second gate electrode 62 is disposed on the second gate insulation layer 52 and is disposed corresponding to the second gate insulation layer 52. The storage capacitor plate 63 is disposed on the third gate insulation layer 53 and is disposed corresponding to the third gate insulation layer 53. The storage capacitor plate 63 is disposed opposite to the first source electrode 21. The gate electrode metal layer 60 further includes a connection pad 64. The connection pad 64 is disposed on the fourth gate insulation layer 54 and is disposed corresponding to the fourth gate insulation layer 54.

Figure 2E:
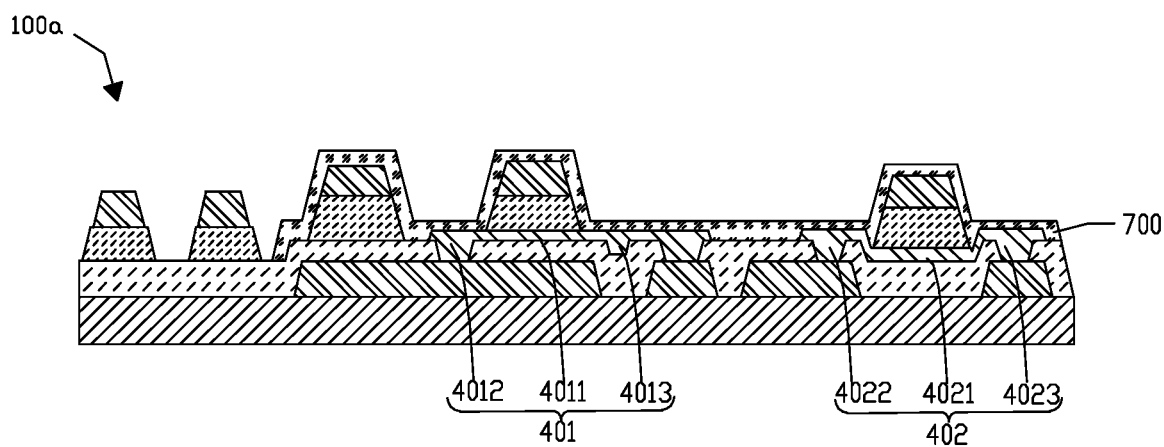

Please refer to FIG. 2(d) to FIG. 2(e). An oxide material layer 70 is formed on the gate electrode metal layer 60 to obtain a semiconductor substrate 100a. The oxide material layer 700 covers the semiconductor layer 400, the gate insulation layer 50, and the gate electrode metal layer 60. Specifically, the oxide material layer 700 covers the first portion 401, the second portion 402, the first gate insulation layer 51, the second gate insulation layer 52, the third gate insulation layer 53, the first gate electrode 61, the second gate electrode 62, and the storage capacitor plate 63. Furthermore, because the first gate insulation layer 51 and the first gate electrode 61 cover the first region 4011 but do not cover the second region 4012 and the third region 4013, the oxide material layer 700 is directly connected to the second region 4012 and the third region 4013. Because the second gate insulation layer 52 and the second gate electrode 62 cover the fourth region 4021 but do not cover the fifth region 4022 and the sixth region 4023, the oxide material layer 700 is directly connected to the fifth region 4022 and the sixth region 4023. The oxide material layer 700 can be formed by depositing an aluminum of a metal or the aluminum of the metal and a doping element material on the gate electrode metal layer 60. The deposition process can be performed in a vacuum or in an oxygen-containing atmosphere, but an oxygen content is controlled only at a level that the deposited aluminum atoms are partially oxidized but are not oxidized completely.

Figure 2F:
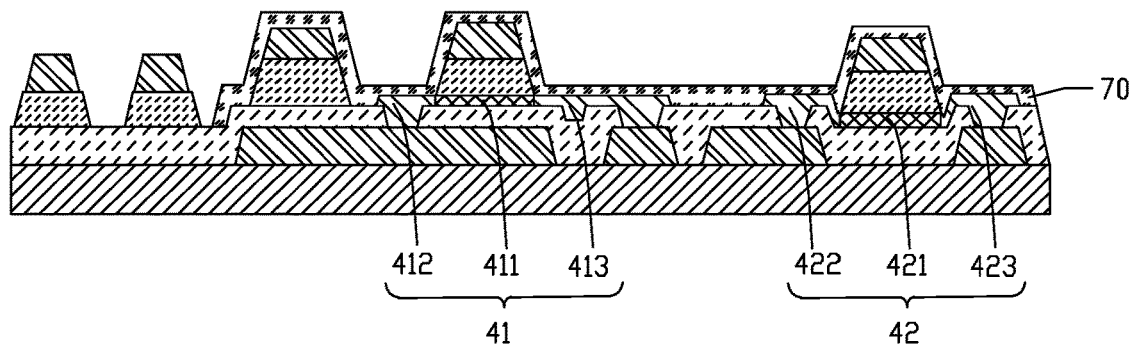

Please refer to FIG. 2(e) to FIG. 2(f). In a dry air atmosphere, the semiconductor substrate 100a is heated at 250° C. for 30 minutes. The aluminum atoms in the oxide material layer 700 capture oxygen in the second region 4012, the third region 4013, the fifth region 4022, and the sixth region 4023 directly connected to the oxide material layer 700, so that the second region 4012, the third region 4013, the fifth region 4022, and the sixth region 4023 are conductorized to form the first source electrode region 2412, the first drain electrode region 2413, the second source electrode region 2422, and the second drain electrode region 2423. However, the first region 4011 covered by the first gate insulation layer 51 and the first gate electrode 61, and the fourth region 4021 covered by the second gate insulation layer 52 and the second gate electrode 62 are not conductorized. At a same time, the aluminum atoms capture the oxygen in the oxide material layer 700 and react with oxygen in the air to form a transparent dense aluminum oxide film, i.e., the oxide layer 70.

Figure 2G:
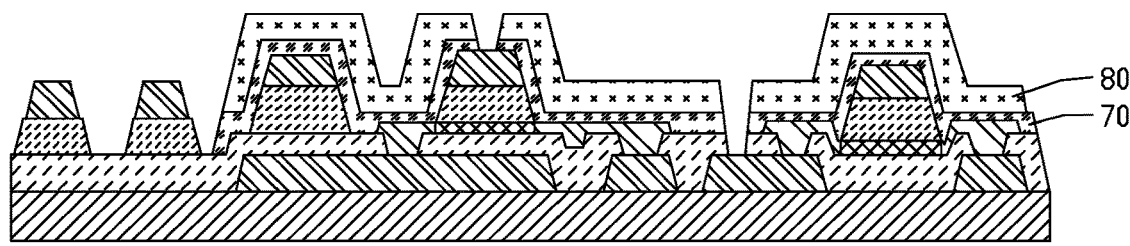

Please refer to FIG. 2(f) to FIG. 2(g). A passivation layer 80 is formed on the oxide layer 70. Via holes are defined in the passivation layer 80. The first gate electrode 61 and the second source electrode 23 are exposed from the via holes.

Figure 2H:
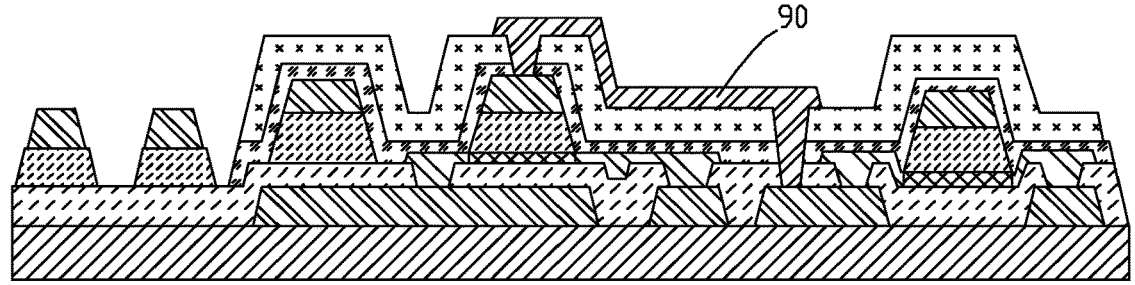

Please refer to FIG. 2(g) to FIG. 2(h). A connection layer 90 is formed on the passivation layer 80. One end of the connection layer 90 is electrically connected to the first gate electrode 61 through the via hole defined in the passivation layer 80, and another end is electrically connected to the second source electrode 23 by penetrating through the via hole in the passivation layer 80, the oxide layer 70, and the interlayer insulation layer 30 to obtain the array substrate 100.

Figure 2I:
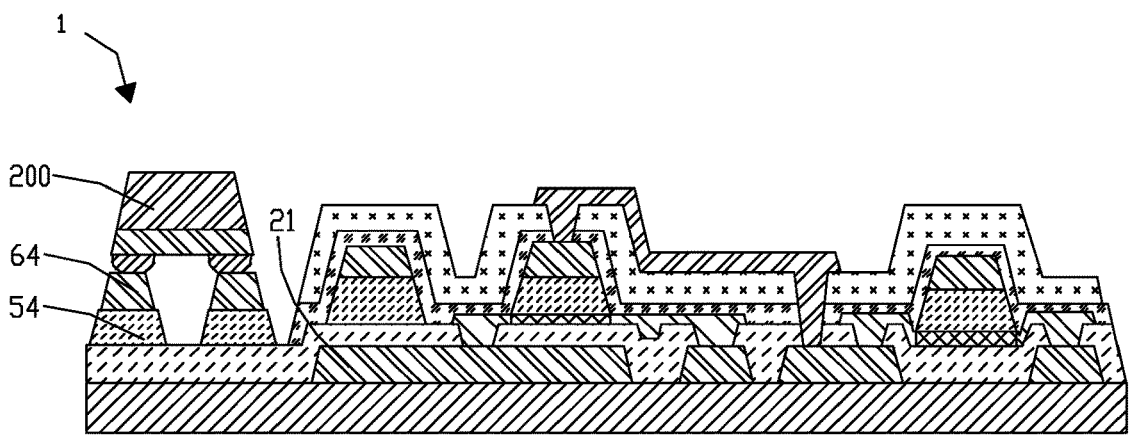

Please refer to FIG. 2(h) to FIG. 2(i). A light-emitting element 200 is bound on the connection pad 64. A display panel 1 is obtained.

Please refer to FIG. 3(a) to FIG. 3(h). FIG. 3(a) to FIG. 3(h) are sectional schematic diagrams of a second embodiment of the manufacturing method of the display panel of the present application.

Figure 3A:
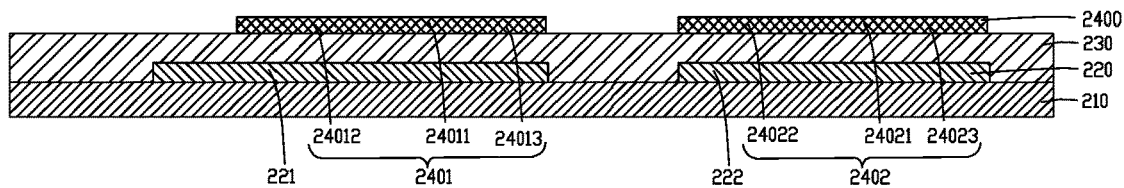
FIG. 3(a) to FIG. 3(h) are sectional schematic diagrams of a second embodiment of the manufacturing method of the display panel of the present application.

Please refer to FIG. 3(a). A substrate 210 is provided. The substrate 210 can be a rigid substrate such as a glass substrate, a plastic substrate, etc., or also can be a flexible substrate. The flexible substrate can include a single flexible organic layer, or can include two or more flexible organic layers, and a barrier layer disposed between two adjacent flexible organic layers. A material of the flexible organic layer is selected from one or more of polyimide (PI), polyethylene naphthalate (PEN), polyethylene terephthalate (PET), polyarylate (PAR), polycarbonate (PC), polyetherimide (PEI), or polyethersulfone (PES). A material of the barrier layer is selected from one or more of inorganic materials such as silicon dioxide, silicon nitride, etc.

A light shielding layer 220 is formed on the substrate 210. The light shielding layer 220 includes a first light shielding layer 221 and a second light shielding layer 222 disposed side by side on the substrate 210. A material of the light shielding layer 220 can be the same material as the source drain electrode metal layer in the first embodiment. The first light shielding layer 221 further acts as one plate of the storage capacitor Cst to perform a function.

A light shielding layer 220 is formed on a buffer layer 230. The buffer layer 230 covers the first light shielding layer 221 and the second light shielding layer 222. A material of the buffer layer 230 can be SiOx, SiNx, SiNOx, or a stacked layer thereof.

A semiconductor layer 2400 is formed on the buffer layer 230. The semiconductor layer 2400 includes a first portion 2401 and a second portion 2402. The first portion 2401 is disposed corresponding to the first light shielding layer 221. The first portion 2401 includes a first region 24011 and a second region 24012 and a third region 24013 located on both sides of the first region 24011. The second portion 2402 is disposed corresponding to the second light shielding layer 222. The second portion 2402 includes a fourth region 24021, and a fifth region 24022 and a sixth region 24023 located on both sides of the fourth region 24021. A material of the semiconductor layer 2400 is a metal oxide semiconductor.

Figure 3B:
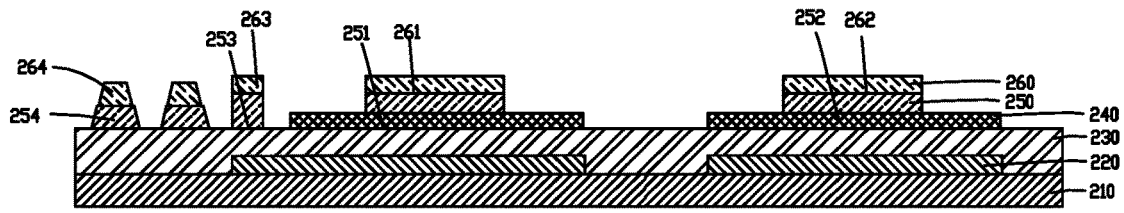

Please refer to FIG. 3(a) to FIG. 3(b). A gate insulation layer 250 is formed on the semiconductor layer 2400. The gate insulation layer 250 includes a first gate insulation layer 251, a second gate insulation layer 252, and a third gate insulation layer 253. The third gate insulation layer 253 is located on a side of the first gate insulation layer 251 away from the second gate insulation layer 252. The first gate insulation layer 251 covers the first region 24011. The second gate insulation layer 252 covers the fourth region 24021. The third gate insulation layer 253 is disposed opposite to the first light shielding layer 221. The gate insulation layer 250 further includes a fourth gate insulation layer 254. The fourth gate electrode 254 is located on a side of the third gate insulation layer 253 away from the first gate insulation layer 251.

A gate electrode metal layer 260 is formed on the gate insulation layer 250. The gate electrode metal layer 260 includes a first gate electrode 261, a second gate electrode 262, and a storage capacitor plate 263. The storage capacitor plate 263 is located on a side of the first gate electrode 261 away from the second gate electrode 262. The first gate electrode 261 is disposed on the first gate insulation layer 251 and is disposed corresponding to the first gate insulation layer 251. The second gate electrode 262 is disposed on the second gate insulation layer 252 and is disposed corresponding to the second gate insulation layer 252. The storage capacitor plate 263 is disposed on the third gate insulation layer 253 and is disposed corresponding to the third gate insulation layer 253. The storage capacitor plate 263 is opposite to a part of the first light shielding layer 221. The gate electrode metal layer 260 further includes a connection pad 264. The connection pad 264 is disposed on the fourth gate insulation layer 254 and is disposed corresponding to the fourth gate insulation layer 254.

Figure 3C:
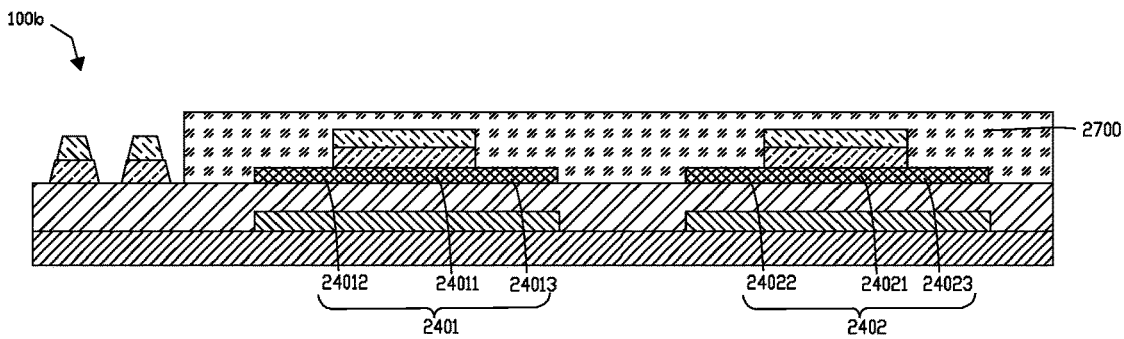

Please refer to FIG. 3(b) to FIG. 3(c). An oxide material layer 2700 is formed on the gate electrode metal layer 260 to obtain a semiconductor substrate 100b. The oxide material layer 2700 covers the semiconductor layer 2400, the gate insulation layer 250, and the gate electrode metal layer 260. Specifically, the oxide material layer 2700 covers the first portion 2401, the second portion 2402, the first gate insulation layer 251, the second gate insulation layer 252, the third gate insulation layer 253, the first gate electrode 261, the second gate electrode 262, and the storage capacitor plate 263. Furthermore, because the first gate insulation layer 251 and the first gate electrode 261 cover the first region 24011 but do not cover the second region 24012 and the third region 24013, the oxide material layer 2700 is directly connected to the second region 24012 and the third region 24013. Because the second gate insulation layer 252 and the second gate electrode 262 cover the fourth region 24021 but do not cover the fifth region 24022 and the sixth region 24023, the oxide material layer 2700 is directly connected to the fifth region 24022 and the sixth region 24023. The oxide material layer 2700 can be formed by depositing an aluminum of a metal or the aluminum of the metal and a doping element material on the gate electrode metal layer 260. The deposition process can be performed in a vacuum or in an oxygen-containing atmosphere, but an oxygen content is controlled only at a level that the deposited aluminum atoms are partially oxidized but are not oxidized completely. Please refer to FIG. 3(c) to FIG. 3(d). In a dry air atmosphere, the semiconductor substrate 100b is heated at 250° C. for 30 minutes. The aluminum atoms in the oxide material layer 2700 capture oxygen in the second region 24012, the third region 24013, the fifth region 24022, and the sixth region 24023 directly connected to the oxide material layer 2700, so that the second region 24012, the third region 24013, the fifth region 24022, and the sixth region 24023 are conductorized to form the first source electrode region 2412, the first drain electrode region 2413, the second source electrode region 2422, and the second drain electrode region 2423. However, the first region 24011 covered by the first gate insulation layer 251 and the first gate electrode 261, and the fourth region 24021 covered by the second gate insulation layer 252 and the second gate electrode 262 are not conductorized. At a same time, the aluminum atoms capture the oxygen in the oxide material layer 2700 and react with oxygen in the air to form a transparent dense aluminum oxide film, i.e., the oxide layer 270.

Figure 3D:
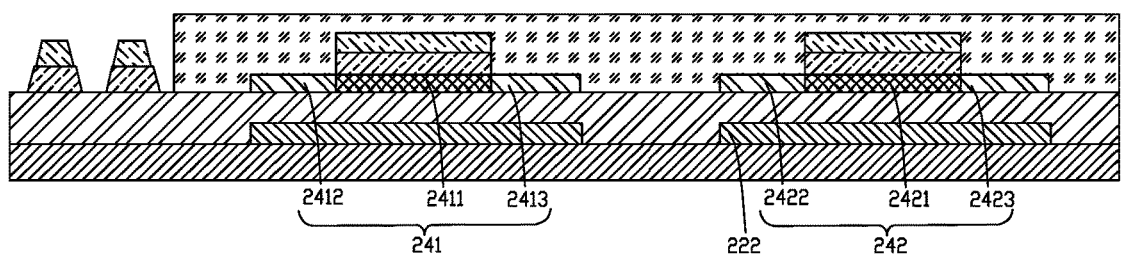
Figure 3E:
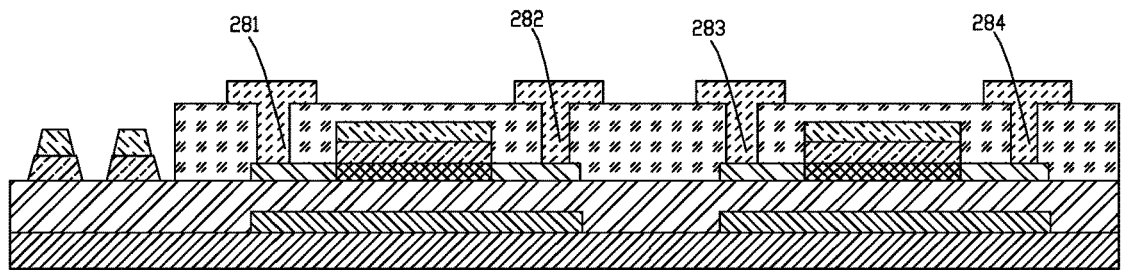

Please refer to FIG. 3(d) to FIG. 3(e). A source drain electrode metal layer 280 is formed on the oxide layer 270. The source drain electrode metal layer 280 includes a first source electrode 281, a first drain electrode 282, a second source electrode 283, and a second drain electrode 284. The first source electrode 281 is connected to the first source electrode region 2412 through the via hole defined in the oxide layer 270. The first drain electrode 282 is connected to the first drain electrode region 2413 through the via hole defined in the oxide layer 270. The second source electrode 283 is connected to the second source electrode region 2422 through the via hole defined in the oxide layer 270. The second drain electrode 284 is connected to the second drain electrode region 2423 through the via hole defined in the oxide layer 270.

Figure 3F:
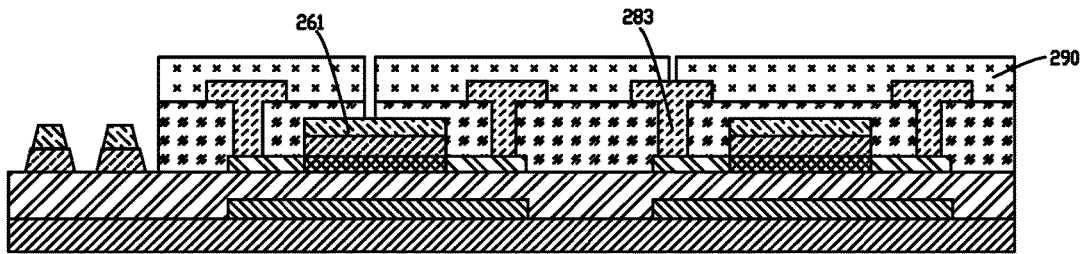

Please refer to FIG. 3(e) to FIG. 3(f). A passivation layer 290 is formed on the source drain electrode metal layer 280. Via holes are defined in the passivation layer 290. The first gate electrode 261 and the second source electrode 283 are exposed from the via holes.

Figure 3G:
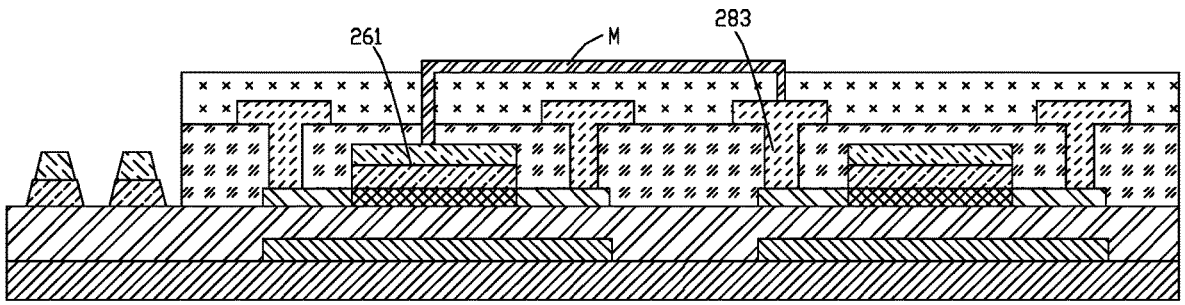

Please refer to FIG. 3(f) to FIG. 3(g). A connection layer M is formed on the passivation layer 290. One end of the connection layer M is electrically connected to the first gate electrode 261 through the via hole defined in the passivation layer 290, and another end is electrically connected to the second source electrode 283 through the via hole defined in the passivation layer 290.

Figure 3H:
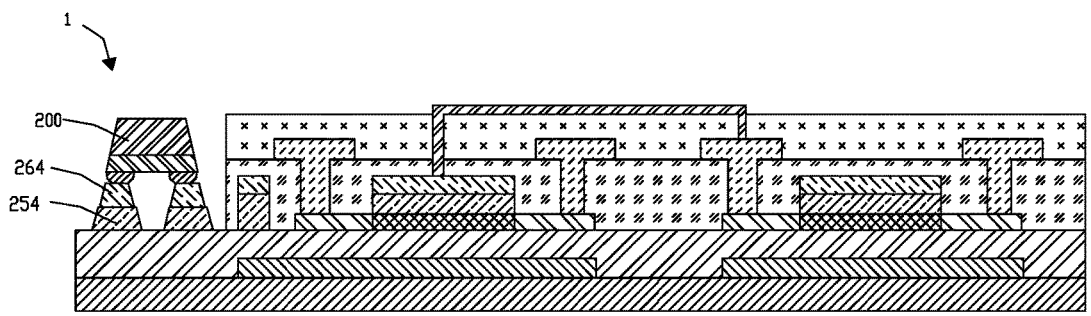

Please refer to FIG. 3(g) to FIG. 3(h). A light-emitting element 200 is bound on the connection pad 264. A display panel 1 is obtained.

In order to prove an effect of the present invention, a sample 1 to a sample 4 are manufactured according to the manufacturing method of the display panel illustrated in FIG. 2(a) to FIG. 2(i), and a comparative sample is manufactured according to a current ion doping method. Wherein, the material of the oxide material layer is a metal of aluminum, and the thickness is nm. A structure of the comparative sample is different from structures of the samples 1 to 4 only in that the oxide layer 270 is not included. Results of mobility and threshold voltages of thin film transistors in the manufactured samples 1 to 4 and the comparative sample are illustrated in table 1 as follow.

TABLE 1

|  | Sample 1 | Sample 2 | Sample 3 | Sample 4 | comparative sample |
|---|---|---|---|---|---|
| mobility (cm²/Vs) | 12.13 | 11.8 | 11.67 | 11.90 | 9.80 |
| ΔVth (V) | 1.2 | 1.1 | 0.94 | 0.98 | 1.67 |

From the experimental results, the mobility of the thin film transistor manufactured according to the present application is greatly improved compared to the prior art, and the threshold voltage is reduced. By analyzing the reason, it can be understood that in the comparative sample, the oxide semiconductor of the source electrode region and the drain electrode region is insufficiently conductorized. After a voltage is applied to the active layer, because the voltage is divided by the source electrode region and the drain electrode region of the oxide semiconductor, the voltage in a channel region becomes smaller, resulting in mobility becoming lower and threshold voltage increasing. However, in the thin film transistor manufactured in the present application, because conductorization of the oxide semiconductor in the source electrode region and the drain electrode region is improved, after the voltage is applied to the active layer, the divided voltage of the oxide semiconductor in the source electrode region and the drain electrode region becomes smaller, the voltage in the channel region becomes larger, resulting in mobility becoming higher and threshold voltage reducing.

The present application further provides an array substrate and a display panel. The display panel can be a mobile phone, a tablet computer, a desktop computer, a laptop computer, an electronic reader, a handheld computer, an electronic display screen, a notebook computer, an ultra-mobile personal computer (UMPC), a netbook, and a cellular phone, a personal digital assistant (PDA), augmented reality (AR) or virtual reality (VR) equipment, a media player, a wearable device, a digital camera, a vehicle-mounted navigator, etc.

The display panel can be an active light-emitting display panel, such as a micro light-emitting diode (micro-LED) display panel, a sub-millimeter light-emitting diode (mini-LED) display panel, or an organic lightemitting diode (OLED) display panel, and can also be a passive light-emitting display panel, such as a liquid crystal display panel.

The display panel includes the array substrate. The array substrate includes a substrate, an active layer, a gate insulation layer, a gate electrode, and an oxide layer. The active layer is located on the substrate. The active layer includes a channel region, and a source electrode region and a drain electrode region located on two sides of the channel region. A material of the active layer is an oxide semiconductor. The gate insulation layer is disposed on a side of the active layer away from the substrate. The gate insulation layer covers the channel region. The gate electrode is disposed on a side of the gate insulation layer away from the active layer. The gate electrode and the gate insulation layer are disposed correspondingly. An oxide layer is disposed on a side of the gate electrode away from the gate insulation layer. The oxide material layer covers the active layer, the gate insulation layer, and the gate electrode. Wherein, the oxide layer is directly connected to the source electrode region and the drain electrode region, and the oxide layer includes aluminium oxide.

In the thin film transistor of the present application, the oxide layer covering the active layer, the gate insulation layer, and the gate electrode is disposed. Furthermore, the oxide layer is directly connected to the source electrode region and the drain electrode region. The oxide layer includes aluminium oxide. In the thin film transistor of the array substrate of the present application, aluminium oxide can be formed by forming a material including aluminum atoms on the gate electrode, and then the material including aluminum atoms is heated, so that the aluminum atoms capture oxygen in the oxide semiconductor layer to form aluminium oxide, and by making the oxide in the oxide semiconductor layer to lose oxygen to become conductive, the source electrode region and the drain electrode of the thin film transistor are formed. Compared to source electrode regions and drain electrode region formed in oxide semiconductor layers by ion doping in the prior art, the process of the array substrate of the present application is simple and has low difficulty. In addition, because the oxide semiconductor thin film transistor is relatively sensitive to water vapor, under influence of water vapor, performance of the oxide semiconductor thin film transistor is prone to change and fails. Aluminum atoms form the transparent and dense aluminum oxide film after capturing oxygen in the oxide semiconductor layer, which can effectively prevent water vapor from invading and can improve device performance.

The display panel 1 of the present application are described in detail as follows.

Figure 4:
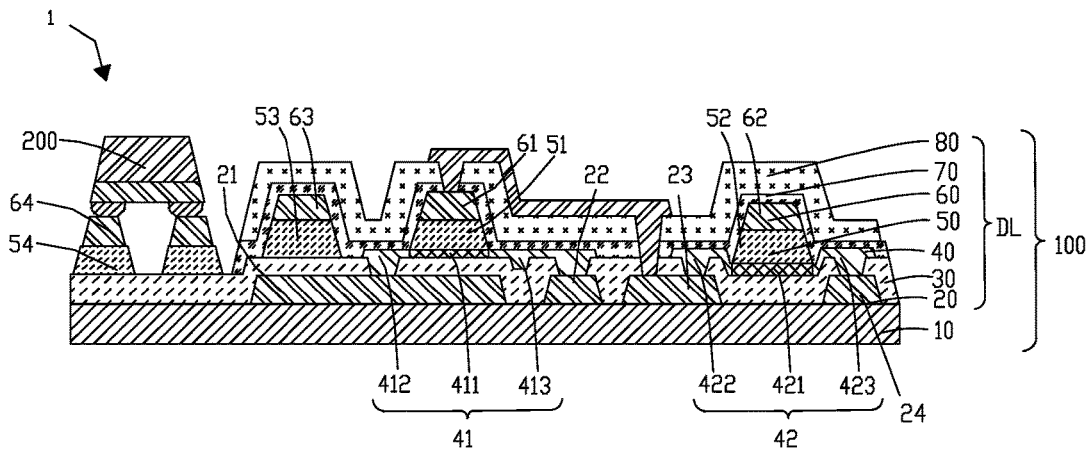
FIG. 4 is a sectional schematic diagram of a first embodiment of a display panel of the present application.

Please refer to FIG. 4. FIG. 4 is a sectional schematic diagram of a first embodiment of a display panel of the present application. The display panel 1 includes an array substrate 100. The array substrate 100 includes a substrate 10 and a pixel circuit DL disposed on the substrate 10. In this embodiment, the display panel 1 is a mini-LED display panel. The display panel 1 further includes a light-emitting element 200 bound on the array substrate 100. The light-emitting element 200 is electrically connected to a pixel circuit DL. The light-emitting element 200 is a mini-LED chip. In some embodiments, the display panel 1 can be a micro-LED display panel, and the light-emitting element 200 can be a micro-LED chip. In some other embodiments, the display panel 1 is an organic light emitting diode (OLED) display panel. The display panel 1 includes the array substrate 100, and the array substrate 100 includes the substrate 10, the pixel circuit DL, and an organic light-emitting layer. The pixel circuit DL is disposed on the substrate 10, and the organic light-emitting layer is disposed on a side of the pixel circuit DL away from the substrate 10.

The substrate 10 can be a rigid substrate such as a glass substrate, a plastic substrate, etc., or also can be a flexible substrate. The flexible substrate can include a single flexible organic layer, or can include two or more flexible organic layers, and a barrier layer disposed between two adjacent flexible organic layers. A material of the flexible organic layer is selected from one or more of polyimide (PI), polyethylene naphthalate (PEN), polyethylene terephthalate (PET), polyarylate (PAR), polycarbonate (PC), polyetherimide (PEI), or polyethersulfone (PES). A material of the barrier layer is selected from one or more of inorganic materials such as silicon dioxide, silicon nitride, etc.

Figure 5:
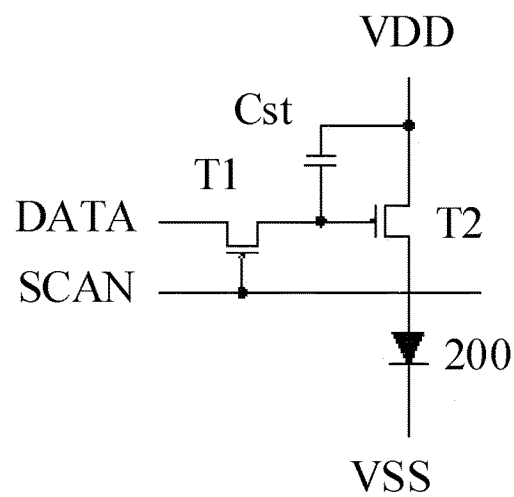
FIG. 5 is an equivalent circuit diagram of a circuit of pixels of the display panel in FIG. 1.

Please refer to FIG. 5. FIG. 5 is an equivalent circuit diagram of a circuit of pixels of the display panel in FIG. 1. The pixel circuit DL includes thin film transistors. Specifically, in this embodiment, the pixel circuit DL can be a 2-transistor-1-capacitor (2T1C) circuit. The pixel circuit DL includes a driving transistor T1, a switch transistor T2, and a storage capacitor Cst. The storage capacitor Cst, the driving transistor T1, and the switch transistor T2 are sequentially arranged on the substrate 10. A connection manner and a driving method of the 2T1C circuit are common technology in this field, and redundant description will not be mentioned herein again. In some embodiments, the display panel 1 is an OLED display panel. The pixel circuit DL can be a pixel circuit generally used in the art such as a 7-transistor-and-1-capacitor (7T1C) circuit or a 5-transistor-and-1-capacitor (5T1C) circuit. Electronic elements and connection relation of the pixel circuit and vary according to a type of the display panel. Redundant description will not be mentioned herein again.

Specifically, the pixel circuit DL includes a source drain electrode metal layer 20, an interlayer insulation layer 30, an active layer 40, a gate electrode insulation layer 50, a gate electrode metal layer 60, an oxide layer 70, a passivation layer 80, and a connection layer 90 sequentially arranged and disposed on the substrate 10.

The source drain electrode metal layer 20 is located on the substrate. The source drain electrode metal layer 20 includes a first source electrode 21, a first drain electrode 22, a second source electrode 23, and a second drain electrode 24 sequentially arranged and disposed on the substrate 10. In this embodiment, the first source electrode 21 acts as a light shielding layer of the active layer 40 and acts as one plate of a storage capacitor Cst to perform a function simultaneously. A material of the source drain electrode metal layer 20 can be Mo, Mo/Al, Mo/Cu, MoTi/Cu, MoTi/Cu/MoTi, TiAlTi, Ti/Cu/Ti, Mo/Cu/IZO, IZO/Cu/IZO, Mo/Cu/ITO, Ni/Cu/Ni, MoTiNi/Cu/MoTiNi, MoNi/Cu/MoNi, NiCr/Cu/NiCr, TiNi/Cu/TiNi, TiCr/Cu/TiCr, or CuNb. It should be noted that Mo/Al means a stacked layer of molybdenum and aluminum. MoTi/Cu means a stacked layer of an alloy of molybdenum and titanium, and copper. Mo/Cu/IZO means a stacked layer of molybdenum, copper and indium zinc oxide, and so on.

The interlayer insulation layer 30 is located on the source drain electrode metal layer 20. The interlayer insulation layer 30 covers the first source electrode 21, the first drain electrode 22, the second source electrode 23, and the second drain electrode 24. A material of the interlayer insulation layer 30 can be selected from SiOx, SiNx, SiNx/SiOx, or SiNOx, etc.

The active layer 40 is located on the interlayer insulation layer 30. The active layer 40 includes a first active layer 41 and a second active layer 42. The first active layer 41 is disposed above the first source electrode 21 and the first drain electrode 22. The first active layer 41 includes a first channel region 411, and a first source electrode region 412 and a first drain electrode region 413 located on two sides of the first channel region 411. The first channel region 411 and the first source electrode 21 are disposed correspondingly. The first source electrode 21 can act as a light shielding layer of the first channel region 411. Specifically, an orthographic projection of the first source electrode 21 on the active layer 40 can cover the first channel region 411. The first source region 412 is connected to the first source electrode 21 through the via hole defined in the interlayer insulation layer 30. The first drain region 413 is connected to the first drain electrode 22 through the via hole defined in the interlayer insulation layer 30. The active layer 42 is disposed above the second source electrode 23 and the second drain electrode 22. The second active layer 42 includes a second channel region 421, and a second source electrode region 422 and a second drain electrode region 423 located on two sides of the second channel region 421. The second source region 422 is connected to the second source electrode 23 through the via hole defined in the interlayer insulation layer 30. The second drain region 423 is connected to the second drain electrode 24 through the via hole defined in the interlayer insulation layer 30. A material of the active layer 40 is a metal oxide semiconductor. Specifically, a material of the active layer 40 can be, for example, indium gallium zinc oxide (IGZO), indium gallium tin oxide (IGTO), indium gallium zinc tin oxide (IGZTO), indium gallium oxide (IGO), indium zinc oxide (IZO), indium zinc tin oxide (IZTO), aluminum indium zinc oxide (AIZO), etc.

The gate insulation layer 50 is located on the active layer 40. The gate insulation layer 50 includes a first gate insulation layer 51, a second gate insulation layer 52, and a third gate insulation layer 53. The third gate insulation layer 53 is located on a side of the first gate insulation layer 51 away from the second gate insulation layer 52. The first gate insulation layer 51 covers the first channel region 411. The second gate insulation layer 52 covers the second channel region 421. The third gate electrode insulation layer 53 is disposed on the interlayer insulation layer 30 and is connected to the interlayer insulation layer 30. The third gate insulation layer 53 and the first source 21 are disposed opposite to each other and separated by the interlayer insulating layer 30. The gate insulation layer 50 further includes a fourth gate insulation layer 54. The fourth gate electrode 54 is located on a side of the third gate insulation layer 53 away from the first gate insulation layer 51. The fourth gate insulation layer 54 is disposed on the interlayer insulation layer 30 and is connected to the interlayer insulation layer 30. A material of the gate insulation layer 50 can be SiOx, SiNx, $Al_2O_3$/SiNx/SiOx, or SiOx/SiNx/SiOx, etc.

The gate electrode metal layer 60 is located on the gate insulation layer 50. The gate electrode metal layer 60 includes a first gate electrode 61, a second gate electrode 62, and a storage capacitor plate 63. The storage capacitor plate 63 is located on a side of the first gate electrode 61 away from the second gate electrode 62. The first gate electrode 61 is disposed on the first gate insulation layer 51 and is disposed corresponding to the first gate insulation layer 51. The second gate electrode 62 is disposed on the second gate insulation layer 52 and is disposed corresponding to the second gate insulation layer 52. The storage capacitor plate 63 is disposed on the third gate insulation layer 53 and is disposed corresponding to the third gate insulation layer 53. The storage capacitor plate 63 is disposed opposite to the first source electrode 21. A gate electrode metal layer 60 further includes a connection pad 64. The connection pad 64 is disposed on the fourth gate insulation layer 54 and is disposed corresponding to the fourth gate insulation layer 54. The connection pad 64 is configured to connect the light-emitting element 200. A material of the gate electrode metal layer 60 can be Mo, Mo/Al, Mo/Cu, Mo/Cu/IZO, IZO/Cu/IZO, Mo/Cu/ITO, Ni/Cu/Ni, MoTiNi/Cu/MoTiNi, NiCr/Cu/NiCr, or CuNb, etc.

The oxide layer 70 is located on the gate electrode metal layer 60. The oxide layer 70 covers the active layer 40, the gate insulation layer and the gate electrode metal layer 60. Specifically, the oxide layer 70 covers the first active layer 41, the second active layer 42, the first gate insulation layer 51, the second gate insulation layer 52, the third gate insulation layer 53, the first gate electrode 61, the second gate electrode 62, and the storage capacitor plate 63. Furthermore, because the first gate insulation layer 51 and the first gate electrode 61 cover the first channel region 411 but do not cover the first source electrode region 412 and the first drain electrode region 413, the oxide layer 70 and the first source electrode region 412 are directly connected to the first drain electrode region 413. Because the second gate insulation layer 52 and the second gate electrode 62 cover the second channel region 421 but do not cover the second source electrode region 422 and the second drain electrode region 423, the oxide layer 70 and the second source electrode region 422 are directly connected to the second drain electrode region 423.

The oxide layer 70 is a transparent film layer. The oxide layer includes aluminium oxide. In the oxide layer 70, aluminium oxide can be formed by forming a material including aluminum atoms on the gate electrode metal layer 60. The material including aluminum atoms is heated, so that the aluminum atoms capture oxygen in the oxide semiconductor layer to form aluminium oxide, and by making the oxide in the oxide semiconductor layer to lose oxygen to become conductive, the source electrode region and the drain electrode region of the thin film transistor are formed. Compared to source electrode regions and drain electrode region formed in oxide semiconductor layers by ion doping in the prior art, the process of the array substrate of the present application is simple and has low difficulty. In addition, because the oxide semiconductor thin film transistor is relatively sensitive to water vapor, under influence of water vapor, performance of the oxide semiconductor thin film transistor is prone to change and fails. Aluminum atoms form the transparent and dense aluminum oxide film after capturing oxygen in the oxide semiconductor layer, which can effectively prevent water vapor from invading and can improve device performance.

In one embodiment, the oxide layer 70 can further include a doping element. Furthermore, the doping element can be selected as a doping element which easily to form a stable oxide with oxygen or aluminum. The doping element can be at least one selected from the group consisting of Si, Mg, N, and B. By mixing the doping element in the oxide layer 70, carrier mobility at a surface where the oxide layer 70 contacts to the source electrode region and the drain electrode region can be increased, resistance of the source electrode region and the drain electrode region can be reduced, and conductivity of the source electrode region and the drain electrode region can be increased. Furthermore, the first source electrode region 412, the first drain electrode region 413, the second source electrode region 422, and the second drain electrode region 423 can also include same doping element. This is because the doping element included in the oxide layer 70 can penetrate into the semiconductor layer to form the source electrode region and the drain electrode region during the formation process of the oxide layer 70, the conductivity of the source electrode region and the drain electrode are further improved. After doping, an oxidation temperature can be lowered to ensure that the aluminum is completely oxidized.

In another embodiment, a material of the oxide layer 70 is AlXaOb, and wherein X is the doping element, X is at least one selected from the group consisting of Si, Mg, N, and B, $0.05 \leq a \leq 0.3$, and $1.5 \leq b < 2.1$. When $0.5 \leq a \leq 0.3$, aluminum oxide in the oxide layer 70 dominates a leading position, and the doping element is in a secondary position, which can capture more oxygen in the oxide semiconductor. Therefore, a purpose of improving conductivity of the source electrode region and the drain electrode region can be realized. Specifically, the material of the oxide layer 70 can be AlSiaOb, AlMgaOb, AlNaOb, ABaOb, Al(SixMgy)aOb, Al(SixNy)aOb, Al(SixBy)aOb, Al(MgxNy)aOb, Al(MgxBy)aOb, Al(NxBy) aOb, Al (SiiMgjNk)aOb, Al(MgiNjBk) aOb, wherein, $x+y=1$, and $i+j+k=1$.

In one embodiment, $0.2 \leq a \leq 0.3$. Experiments have proved that when $0.2 \leq a \leq 0.3$, a better effect of improving the conductivity of the source electrode region and the drain electrode region can be achieved.

In one specific embodiment, the material of the oxide layer 70 is AlSiaOb, and wherein 0.05≤a≤0.3, and 1.5≤b≤1.9. Two materials of aluminum and silicon together can ensure fully oxidization at a lower temperature, such as 200° C., so difficulty of the process is lowered.

In one embodiment, a thickness of the oxide layer 70 ranges from 5 nm to 15 nm. If the thickness exceeds 15 nm, the display panel is caused to be scrapped. If the thickness is less than 5 nm, the thin film transistor with improved mobility cannot be obtained.

The passivation layer 80 is located on the oxide layer 70 and covers the oxide layer 70. The material of the passivation layer 80 can be SiOx, SiNx, SiNOx, SiOx/SiNx, AlOx or a stacked layer thereof.

The connection layer 90 is located on the passivation layer 80 and is configured to connect the driving transistor T1 and the switch transistor T2. One end of the connection layer 90 is electrically connected to the first gate electrode 61 through the via hole defined in the passivation layer 80, and another end is electrically connected to the second source electrode 23 by penetrating through the via hole in the passivation layer 80, the oxide layer 70, and the interlayer insulation layer 30. The material of the connection layer 90 can be indium tin oxide (ITO), indium zinc oxide (IZO) or a metal-type film layer, such as Mo, MoTi, MoTiNi, Mo/Cu/Mo, Mo/Al, Mo/Cu, Mo/Cu/IZO, IZO/Cu/IZO, Mo/Cu/ITO, Ni/Cu/Ni, MoTiNi/Cu/MoTiNi, NiCr/Cu/NiCr, or CuNb.

The first source electrode 21, the first drain electrode 22, the first active layer 41, and the first gate electrode 61 compose the driving transistor T1 of the pixel circuit DL. The second source electrode 23, the second drain electrode 24, the second active layer 42, and the second gate electrode 62 compose the switch transistor T2 of the pixel circuit DL. The storage capacitor plate 63, the third gate insulation layer 53, the interlayer insulation layer interlayer insulation layer 30, and the first source electrode 21 compose the storage capacitor Cst of the pixel circuit DL together.

The light-emitting element 200 is bound on the connection pad 64. The light-emitting element 200 emits light under by driving of the pixel circuit DL, thereby displaying images.

The thin film transistor, the array substrate and the display panel of the present application have simple processes and low difficulty. In addition, in the present application, a structure located between the active layer and the substrate where the source drain electrode metal layer is, which can save processes of the photomask.

Figure 6:
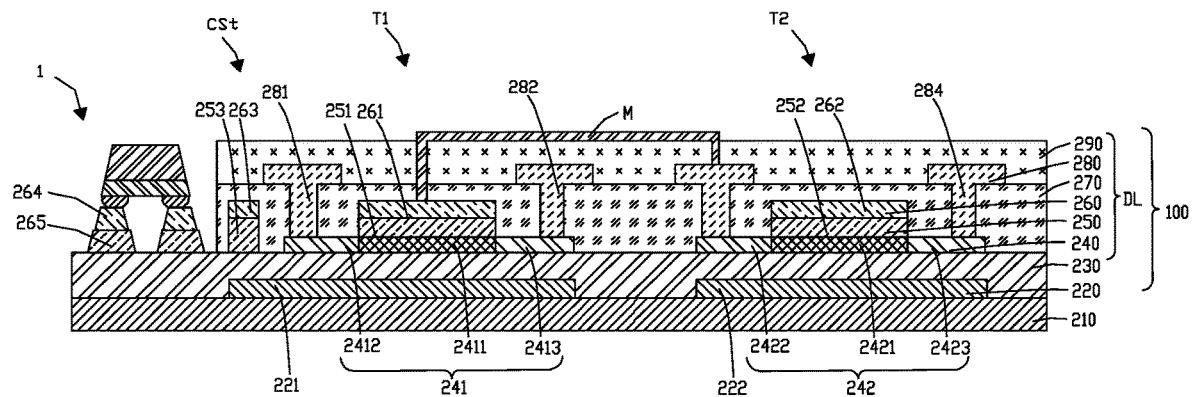
FIG. 6 is a sectional schematic diagram of a second embodiment of the display panel of the present application.

Please refer to FIG. 6. FIG. 6 is a sectional schematic diagram of a second embodiment of the display panel of the present application. Difference between the second embodiment and the first embodiment is that the source drain electrode metal layer is located on a side of the oxide layer away from the active layer.

Specifically, the pixel circuit DL includes a light shielding layer 220, a buffer layer 230, an active layer 240, a gate insulation layer 250, a gate electrode metal layer 260, a oxide layer 270, a source drain electrode metal layer 280, a passivation layer 290, and a connection layer M sequentially arranged and disposed on the substrate 210. It should be noted that in this embodiment, the oxide layer 270 can act as an interlayer insulation layer and perform a function thereof simultaneously. In other embodiment, an oxide layer 270 between the gate electrode metal layer 260 and the interlayer insulation layer can be disposed additionally.

The light shielding layer 220 is located on the substrate 210. The light shielding layer 220 includes a first light shielding layer 221 and a second light shielding layer 222 disposed side by side on the substrate 210. A material of the light shielding layer 220 can be the same material as the source drain electrode metal layer in the first embodiment. The first light shielding layer 221 further acts as one plate of the storage capacitor Cst to perform a function.

The buffer layer 230 is located on the light shielding layer 220. The buffer layer 230 covers the first light shielding layer 221 and the second light shielding layer 222. A material of the buffer layer 230 can be SiOx, SiNx, SiNOx, or a stacked layer thereof.

The active layer 240 is located on the buffer layer 230. The active layer 240 includes a first active layer 241 and a second active layer 242. The first active layer 241 is disposed corresponding to the first light shielding layer 221. The first active layer 241 includes a first channel region 2411, and a first source electrode region 2412 and a first drain electrode region 2413 located on two sides of the first channel region 2411. The second active layer 242 is disposed corresponding to the first active layer 241. The second active layer 242 includes a second channel region 2421, and a second source electrode region 2422 and a second drain electrode region 2423 located on two sides of the second channel region 2421.

The gate insulation layer 250 is located on the active layer 240. The gate insulation layer 250 includes a first gate insulation layer 251, a second gate insulation layer 252, and a third gate insulation layer 253. The third gate insulation layer 253 is located on a side of the first gate insulation layer 251 away from the second gate insulation layer 252. The first gate insulation layer 251 covers the first channel region 2411. The second gate insulation layer 252 covers the second channel region 2421. The third gate insulation layer 253 is disposed opposite to the first light shielding layer 221. The gate insulation layer 250 further includes a fourth gate insulation layer 254. The fourth gate electrode 254 is located on a side of the third gate insulation layer 253 away from the first gate insulation layer 251.

The gate electrode metal layer 260 is located on the gate insulation layer 250. The gate electrode metal layer 260 includes a first gate The storage capacitor plate 263 is located on a side of the first gate electrode 261 away from the second gate electrode 262. The first gate electrode 261 is disposed on the first gate insulation layer 261 and is disposed corresponding to the first gate insulation layer 261. The second gate electrode 262 is disposed on the second gate insulation layer 262 and is disposed corresponding to the second gate insulation layer 262. The storage capacitor plate 263 is disposed on the third gate insulation layer 253 and is disposed corresponding to the third gate insulation layer 253. The storage capacitor plate 263 is opposite to a part of the first light shielding layer 221. The gate electrode metal layer 260 further includes a connection pad 264. The connection pad 264 is disposed on the fourth gate insulation layer 254 and is disposed corresponding to the fourth gate insulation layer 254.

The oxide layer 270 covers the active layer 240, the gate insulation layer 250, and the gate electrode metal layer 260. Specifically, the oxide layer 270 covers the first active layer 241, the second active layer 242, the first gate insulation layer 251, the second gate insulation layer 252, the third gate insulation layer 253, the first gate electrode 261, the second gate electrode 262, and the storage capacitor plate 263. Furthermore, because the first gate insulation layer 251 and the first gate electrode 261 cover the first channel region 2411 but do not cover the first source electrode region 2412 and the first drain electrode region 2413, the oxide layer 270 and the first source electrode region 2412 are directly connected to the first drain electrode region 2413. Because the second gate insulation layer 252 and the second gate electrode 262 cover the second channel region 2421 but do not cover the second source electrode region 2422 and the second drain electrode region 2423, the oxide layer 270 and the second source electrode region 2422 are directly connected to the second drain electrode region 2423.

The oxide layer 270 is a transparent film layer. The oxide layer 270 includes aluminium oxide. In the oxide layer 270, aluminium oxide can be formed by forming a material including aluminum atoms on the gate electrode metal layer 260. The material including aluminum atoms is heated, so that the aluminum atoms capture oxygen in the oxide semiconductor layer to form aluminium oxide, and by making the oxide in the oxide semiconductor layer to lose oxygen to become conductive, the source electrode region and the drain electrode of the thin film transistor are formed. Compared to source electrode regions and drain electrode region formed in oxide semiconductor layers by ion doping in the prior art, the process of the array substrate of the present application is simple and has low difficulty. In addition, because the oxide semiconductor thin film transistor is relatively sensitive to water vapor, under influence of water vapor, performance of the oxide semiconductor thin film transistor is prone to change and fails. Aluminum atoms form the transparent and dense aluminum oxide film after capturing oxygen in the oxide semiconductor layer, which can effectively prevent water vapor from invading and can improve device performance.

In one embodiment, the oxide layer 270 can further include a doping element. Furthermore, the doping element can be selected as a doping element which easily to form a stable oxide with oxygen or aluminum. The doping element can be at least one selected from the group consisting of Si, Mg, N, and B. By mixing the doping element in the oxide layer 270, carrier mobility at a surface where the oxide layer 270 contacts to the source electrode region and the drain electrode region can be increased, resistance of the source electrode region and the drain electrode region can be reduced, and conductivity of the source electrode region and the drain electrode region can be increased. Furthermore, the first source electrode region 2412, the first drain electrode region 2413, the second source electrode region 2422, and the second drain electrode region 2423 can also include same doping element. This is because the doping element included in the oxide layer 270 can penetrate into the semiconductor layer to form the source electrode region and the drain electrode region during the formation process of the oxide layer 270, the conductivity of the source electrode region and the drain electrode are further improved. After doping, an oxidation temperature can be lowered to ensure that the aluminum is completely oxidized.

In another embodiment, a material of the oxide layer 270 is $AlX_aO_b$, and wherein X is the doping element, X is at least one selected from the group consisting of Si, Mg, N, and B, $0.05 \leq a \leq 0.3$, and $1.5 \leq b < 2.1$. When $0.05 \leq a \leq 0.3$, aluminum oxide in the oxide layer 270 dominates a leading position, and the doping element is in a secondary position, which can capture more oxygen in the oxide semiconductor. Therefore, a purpose of improving conductivity of the source electrode region and the drain electrode region can be realized. Specifically, the material of the oxide layer 270 can be $AlSi_aO_b$, $AlMg_aO_b$, $AlNa_aO_b$, $AlB_aO_b$, $Al(Si_xMg_y)_aO_b$, $Al(Si_xN_y)_aO_b$, $Al(Si_xB_y)_aO_b$, $Al(Mg_xN_y)_aO_b$, $Al(Mg_xB_y)_aO_b$, $Al(N_xB_y)_aO_b$, $Al(Si_iMg_jN_k)_aO_b$, $Al(Mg_iN_jB_k)_aO_b$, wherein, $x+y=1$, and $i+j+k=1$.

In one embodiment, $0.2 \leq a \leq 0.3$. Experiments have proved that when $0.2 \leq a \leq 0.3$, a better effect of improving the conductivity of the source electrode region and the drain electrode region can be achieved.

In one specific embodiment, a material of the oxide layer 270 is $AlSi_aO_b$, and wherein $0.05 \leq a \leq 0.3$, and $1.5 \leq b \leq 1.9$. Two materials of aluminum and silicon together can ensure fully oxidization at a lower temperature, such as 200° C., so difficulty of the process is lowered.

In one embodiment, a thickness of the oxide layer 270 ranges from 5 nm to 15 nm. If the thickness exceeds 15 nm, the display panel is caused to be scrapped. If the thickness is less than 5 nm, the thin film transistor with improved mobility cannot be obtained.

The source drain electrode metal layer 280 is located on the oxide layer 270. The source drain electrode metal layer 280 includes a first source electrode 281, a first drain electrode 282, a second source electrode 283, and a second drain electrode 284. The first source electrode 281 is connected to the first source electrode region 2412 through the via hole defined in the oxide layer 270. The first drain electrode 282 is connected to the first drain electrode region 2413 through the via hole defined in the oxide layer 270. The second source electrode 283 is connected to the second source electrode region 2422 through the via hole defined in the oxide layer 270. The second drain electrode 284 is connected to the second drain electrode region 2423 through the via hole defined in the oxide layer 270.

The passivation layer 290 covers the oxide layer 270 and the source drain electrode metal layer 280. The material of the passivation layer 290 can be SiOx, SiNx, SiNOx, SiOx/SiNx, AlOx or a stacked layer thereof. The connection layer M is located on the passivation layer 290 and is configured to connect the driving transistor T1 and the switch transistor T2. One end of the connection layer M is electrically connected to the first gate electrode 261 through the via hole defined in the passivation layer 290, and another end is electrically connected to the second source electrode 283 through the via hole defined in the passivation layer 290.

Materials of the source drain electrode metal layer, the interlayer insulation layer, the active layer, the gate electrode insulation layer, the gate electrode metal layer, the oxide layer, the passivation layer, and the connection layer of the second embodiment of the present application are same as materials of the first embodiment, and redundant description will not be mentioned herein again.

An array substrate having thin film transistors of a top-gate structure can be manufactured according to the embodiments of the present application.

The above provides a detailed description to the embodiments of present application. The principle and implementation manner of present application are described herein with reference to specific embodiments. The foregoing descriptions of the embodiments are merely used for better understanding of the present application. Meanwhile, for a person of ordinary skill in the art can make variations and modifications to the specific implementation manner and application scope according to the idea of this application. In summary, contents of the specification shall not be construed as a limitation to this application.

What is claimed is:

1. A manufacturing method of an array substrate, comprising following steps:
   providing a substrate and forming a semiconductor layer on the substrate, wherein the semiconductor layer comprises a first region, and a second region and a third region located on two sides of the first region, and a material of the semiconductor layer is a semiconductor oxide;

forming a gate insulation layer on a side of the semiconductor layer away from the substrate, wherein the gate insulation layer covers the first region;

forming a gate electrode on the gate insulation layer, wherein the gate electrode and the gate insulation layer are disposed correspondingly;

forming an oxide material layer on the gate electrode, wherein the oxide material layer covers the semiconductor layer, the gate insulation layer, and the gate electrode, the oxide material layer is directly connected to the second region and the third region to obtain a semiconductor substrate, and the oxide material layer comprises aluminum atoms; and heating the semiconductor substrate, wherein the oxide material layer captures oxygen in the second region and the third region to form an oxide layer, the second region is conductorized to form a source electrode region, and the third region is conductorized to form a drain electrode region.

2. The manufacturing method of the array substrate as claimed in claim 1, wherein the oxide material layer comprises a doping element.

3. The manufacturing method of the array substrate as claimed in claim 2, wherein a material of the oxide material layer is AlXaOc, and wherein X is the doping element, X is at least one selected from the group consisting of Si, Mg, N, and B, $0.05 \leq a \leq 0.3$, and $0 \leq c < 1.5$.

4. The manufacturing method of the array substrate as claimed in claim 1, wherein heating the semiconductor substrate to allow the oxide material layer to capture the oxygen in the second region and the third region to form the oxide layer, the second region is conductorized to form the source electrode region, and the third region is conductorized to form the drain electrode region comprise:

exposing the oxide material layer in an oxygen-containing atmosphere to make the oxide material layer contact to oxygen to form the oxide layer.

5. The manufacturing method of the array substrate as claimed in claim 1, wherein before forming the semiconductor layer on the substrate, the manufacturing method of the array substrate comprises: forming a source electrode and a drain electrode on the substrate;

wherein the source electrode is connected to the source electrode region, and the drain electrode is connected to the drain electrode region.

6. The manufacturing method of the array substrate as claimed in claim 1, wherein after heating the semiconductor substrate to allow the oxide material layer to capture the oxygen in the second region and the third region to form the oxide layer, the second region is conductorized to form the source electrode region, and the third region is conductorized to form the drain electrode region, the manufacturing method of the array substrate comprises:

forming a source electrode and a drain electrode on a side of the oxide layer away from the semiconductor layer, wherein the source electrode is connected to the source electrode region, and the drain electrode is connected to the drain electrode region.

7. The manufacturing method of the array substrate as claimed in claim 1, wherein heating the semiconductor substrate to allow the oxide material layer to capture the oxygen in the second region and the third region to form the oxide layer, the second region is conductorized to form the source electrode region, and the third region is conductorized to form the drain electrode region comprise:

heating the semiconductor substrate for 20 minutes to 60 minutes at a temperature in a range from 200° C. to 300° C.

* * * * *